US010175285B2

United States Patent
(12) Martini et al.

(10) Patent No.: US 10,175,285 B2
(45) Date of Patent: Jan. 8, 2019

(54) DEVICE FOR MONITORING AN OPERATION OF AN INDUCTIVE ELEMENT

(71) Applicant: Robert Bosch GmbH, Stuttgart (DE)

(72) Inventors: Marco Martini, Reutlingen (DE); Bernd Mueller, Reutlingen (DE); Uwe Guenther, Nufringen (DE); Bertrand Eric Meli, Reutlingen (DE); Frank Henkel, Kirchentellinsfurt (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/532,286

(22) Filed: Nov. 4, 2014

(65) Prior Publication Data

US 2015/0123675 A1 May 7, 2015

(30) Foreign Application Priority Data

Nov. 5, 2013 (DE) ........................ 10 2013 222 405

(51) Int. Cl.
*G01R 31/06* (2006.01)

(52) U.S. Cl.
CPC .................................... *G01R 31/06* (2013.01)

(58) Field of Classification Search
CPC ...................................................... G01R 31/06
USPC ......................................................... 324/546
See application file for complete search history.

(56) References Cited

U.S. PATENT DOCUMENTS 5,500,598 A * 3/1996 Ford .................... G01R 31/027 324/546
5,751,132 A * 5/1998 Horvath ............... G01R 31/343 318/490
6,242,899 B1 * 6/2001 Miller .................. G01R 13/345 324/76.24
2006/0098377 A1 * 5/2006 Kuehn ................... G05B 19/19 361/160
2009/0001976 A1 * 1/2009 Cech ................... B60R 21/0134 324/228
2010/0060257 A1 * 3/2010 Azrai ................ G01R 19/0092 324/76.11
2010/0074365 A1 * 3/2010 Ladebeck ............ A61B 6/5247 375/285
2010/0164516 A1 7/2010 Lammers et al.
(Continued)

FOREIGN PATENT DOCUMENTS

DE 10 2006 029389 1/2008
JP H10208057 A 8/1998
JP 2009182899 A 8/2009

*Primary Examiner* — Son Le
*Assistant Examiner* — Akm Zakaria
(74) *Attorney, Agent, or Firm* — Norton Rose Fulbright US LLP

(57) ABSTRACT

A device for monitoring an operation of an inductive element, includes a current-measuring device is switched in series with the inductive element. The device is configured to ascertain a first time-discrete and value-discrete signal, which characterizes a current flowing through the current-measuring device; to ascertain a second time-discrete and value-discrete signal, which characterizes a current flowing through the current-measuring device and has a predefinable time shift in relation to the first signal; and to infer the presence of a shunt from a comparison of the first signal with the second signal. Also described is a method for monitoring the operation of the inductive element.

14 Claims, 8 Drawing Sheets

22 12b 12 24 18 12a 25 13 10 36 28 14 34 27 29 20b s1 A 20 D 20a 26 32 16 33 18 18 30

(56) References Cited

U.S. PATENT DOCUMENTS

2011/0144934 A1* 6/2011 Bilgin ................ H03H 17/0642
702/66
2012/0025845 A1* 2/2012 Carrobe ................ B41J 2/0451
324/551

* cited by examiner 20b
20
20a
34
D
A
50
52
48
s1
s1
38
s2
28
40
41
d12
44
42
75
46
47
36

28
34
A
D
20
16
18
54
56
58
60
38
s1
s2
s1'
s2'
62
63
41
d12'
75
44
46
47

28
34
A
D
20
16
54
56
40
+
-
41
s1
s2
38
d12
58
d12'
75
42
44
46
47

28
34
A
D
s1
64
s1'
54
56
38
s2'
40
+
-
d12'
58
d12''
75
42
44
46

28
34
A
D
s1
64
38
s2
66
s1'
54
56
40
+
-
41
s2'
d12'
58
d12''
75
42
44
46
47

DEVICE FOR MONITORING AN OPERATION OF AN INDUCTIVE ELEMENT

RELATED APPLICATION INFORMATION

The present application claims priority to and the benefit of German patent application no. 10 2013 222 405.2, which was filed in Germany on Nov. 5, 2013, the disclosure of which is incorporated herein by reference.

FIELD OF THE INVENTION

The present invention relates to a device, and to a related method.

BACKGROUND INFORMATION

Electromagnetic actuating devices, for instance for a transmission control system of an automatic transmission of a motor vehicle or for a fuel injector of an internal combustion engine, are known from the market. An inductive element in these devices is energized for a predefinable period of time using a defined average value of a current. In particular, the inductive element is periodically switchable, at a predefinable frequency and a predefinable pulse control factor, to an operating voltage, from which said average value results and subsequently, a certain opening cross-section of a valve, for example.

An electronic circuit for operating the inductive element is referred to as a "current controller", for example. It is furthermore known that a possible electrical shunt to the inductive element can affect its operation to a considerable degree. A patent publication from the specialized field is the DE 10 2006 029 389 A1, for example.

SUMMARY OF THE INVENTION

The problem on which the present invention is based is solved by a device as described herein and also by a method as described herein. Advantageous refinements are indicated in the further descriptions herein.

Important features for the present invention are also found in the following description and in the drawings; the features may be essential for the present invention both by themselves and also in different combinations, without any further explicit reference.

The present invention relates to a device for monitoring an operation of an inductive element, in which a current-measuring device is switched in series with the inductive element. According to the present invention, the device is configured to ascertain a first time-discrete and value-discrete signal, which characterizes a current flowing through the current measuring device; moreover, it is configured to ascertain a second time-discrete and value-discrete signal, which characterizes a current flowing through the current-measuring device and which has a predefinable temporal shift in relation to the first signal and furthermore, to infer the existence of a shunt from a comparison of the first signal with the second signal.

In general, a shunt is an unwanted and parasitic resistance from a terminal of the inductive element to a zero potential or an operating voltage potential or the like. If the shunt has relatively low resistance, then this shunt is easily detectable as a short circuit. If the shunt features relatively high resistance, then it may be difficult or impossible to detect it, but it has no real effect on the operation of the inductive element. In the case at hand, the focus in particular is on a shunt that is neither "high-resistance" nor "low-resistance" within this meaning.

The device according to the present invention operates with digital signals, so that, among other things, a simplified configuration is possible as well as reduced chip costs with regard to a conceivable analog realization. Also, the temperature stability of the device is relatively good because of the use of digital signals. Better flexibility results in addition if the device is to be able to alternatively monitor inductive elements having different sizes. Thus, the device may also be applied in an uncomplicated manner, as the case may be. In particular, the present invention is able to be used in an especially uncomplicated manner because, in contrast to conceivable alternative devices, it is not necessary to explicitly predefine one or more measuring instant(s) to be analyzed for the current flowing through the current-measuring device. This results in increased robustness for the device of the present invention, such as with regard to switching flanks of different steepness at the inductive element. Moreover, the present invention requires no time synchronization with respect to a particular switching operation of the inductive element. The fact that the measuring device, which may be a measuring resistor, can be configured as a relatively low-resistance device is another advantage of the device of the present invention.

In one development, the device is configured to ascertain the first signal in that a voltage drop which arises in the current-measuring device and characterizes the current flowing through the current-measuring device is ascertained and converted into the first signal by an A/D converter, especially by a sigma-delta A/D converter. In particular, an A/D converter that may already be available for a current regulation of the inductive element (also known as an "analog-digital converter") is able to be shared for the functionalities according to the present invention, so that further costs may be saved. The sigma-delta A/D converter is especially suitable for monitoring the operation of the inductive element according to the present invention. For example, the sigma-delta A/D converter may be implemented as a so-called converter of the first order or as a converter of the second or higher order. As an alternative, the use of virtually any other analog-to-digital converter such as one having a value resolution of 4 bit, 8 bit, 12 bit, 16 bit or the like, for example, is possible according to the present invention.

In one further development, the device is configured to obtain the second signal from the first signal through a delay operation. Digital elements make this possible in an especially simple yet precise manner, so that costs are able to be saved and the robustness of the device improved.

In one further development, the device is configured to execute the following steps within the framework of the comparison:

- Calculating a signal that characterizes a difference between the first signal and the second signal, especially by forming the difference between the first and second signal; and
- Comparing the signal that characterizes the difference between the first signal and the second signal and/or a signal derived therefrom, with a corresponding predefinable threshold value.

Among other things, the use of the threshold value also makes it possible to predefine a measure starting from which the shunt is evaluated as "serious". The robustness of the device is therefore able to be increased and the application possibilities can be expanded in an advantageous manner.

In addition, it may be provided to configure the device in such a way that the signal that characterizes the difference between the first signal and the second signal and/or a signal derived therefrom is subjected to filtering and/or decimation and/or a sampling-rate reduction. Filtering makes it possible to effectively reduce possible interference signals and/or quantization noise of the sigma-delta A/D converter or the like. Because of the decimation and/or the sampling rate reduction the required work and expense with regard to the switching circuit is able to be reduced, so that cost advantages may result.

In one further development, the device is configured to execute the following steps within the framework of the comparison:

Subjecting the first signal and/or the second signal to filtering and/or decimation and/or a sampling-rate reduction in order to obtain a filtered and/or sampling-rate-reduced first signal and/or a filtered and/or sampling-rate-reduced second signal;

Calculating a difference between the filtered and/or sampling-rate-reduced first signal and the filtered and/or sampling-rate-reduced second signal, especially through a difference calculation, in order to obtain a signal that characterizes the difference between the filtered and/or sampling-rate-reduced first signal and the filtered and/or sampling-rate reduced second signal; and Comparing the signal that characterizes the difference between the filtered and/or sampling-rate-reduced first signal and the filtered and/or sampling-rate-reduced second signal and/or a signal derived therefrom, with the corresponding predefinable threshold value. The filtering or the decimation or the sampling-rate reduction for the first and the second signal advantageously utilizes the same parameters in each case. The further refinement of the device describes a number of especially suitable developments of the device of the present invention. For example, the filtering or decimation or the sampling-rate reduction may be performed separately for each signal s1 and s2, or in a linear and time-invariant system, said operations may be applied to the ascertained difference of signals s1 and s2, especially the differential, so that work and costs are able to be saved.

It may furthermore be provided that the filtered and/or sampling-rate-reduced first signal and/or the filtered and/or sampling-rate-reduced second signal and/or the signal that characterizes the difference between the filtered and/or sampling-rate-reduced first signal and the filtered and/or sampling-rate-reduced second signal have/has a lower scanning rate than the first signal and/or the second signal. The lower scanning rate makes it possible to save work and costs.

It may furthermore be provided that the filtered and/or sampling-rate-reduced first signal and/or the filtered and/or sampling-rate-reduced second signal and/or the signal that characterizes the difference between the filtered and/or sampling-rate-reduced first signal and the filtered and/or sampling-rate-reduced second signal have/has a different value resolution (e.g., a 10 bit versus a 16 bit value resolution) than the first signal and/or the second signal. A reduced value resolution, in particular, likewise makes it possible to save work and costs.

The present invention furthermore relates to a method for monitoring the operation of the inductive element. Similar to the afore-described developments of the device, the method, too, is able to be implemented in a variety of developments. The resulting advantages are comparable to those in the device, so that these advantages will not be described again in the following text.

The present invention therefore also relates to a method for monitoring the operation of the inductive element, in which a current-measuring device is switched in series with the inductive element. According to the present invention, the method includes the following steps: Ascertaining a first time-discrete and value-discrete signal, which characterizes a current flowing through the current measuring device; ascertaining a second time-discrete and value-discrete signal, which characterizes a current flowing through the current-measuring device and which has a predefinable temporal shift in relation to the first signal; and comparing the first signal with the second signal in order to infer the existence of a shunt.

In one development of the method, the first signal is ascertained in that a voltage drop which arises in the current-measuring device and characterizes the current flowing through the current-measuring device is determined and converted into the first signal by an A/D converter, especially by the sigma-delta A/D converter.

In one further development of the method, the second signal is formed from the first signal by a delay operation.

In one further development of the method, the following steps are executed within the framework of the comparison: Forming a signal that characterizes a difference between the first signal and the second signal, especially by calculating the difference between the first and second signal; and comparing the signal that characterizes the difference between the first signal and the second signal and/or a signal derived therefrom, with a corresponding predefinable threshold value.

In one further development of the method, the signal that characterizes the difference between the first signal and the second signal and/or a signal derived therefrom is subjected to filtering and/or decimation and/or a sampling rate reduction.

In one further development of the method, the following steps are executed within the framework of the comparison: Subjecting the first signal and/or the second signal to filtering and/or decimation and/or a sampling-rate reduction in order to obtain a filtered and/or sampling-rate-reduced first signal and/or a filtered and/or sampling-rate-reduced second signal; calculating the difference between the filtered and/or sampling-rate-reduced first signal and the filtered and/or sampling-rate-reduced second signal, especially by subtraction, in order to obtain a signal that characterizes the difference between the filtered and/or sampling-rate-reduced second signal; and comparing the signal that characterizes the difference between the filtered and/or sampling-rate-reduced first signal and the filtered and/or sampling-rate-reduced second signal and/or a signal derived therefrom, with a corresponding predefinable threshold value.

In one further development of the method, the filtered and/or sampling-rate-reduced first signal and/or the filtered and/or sampling-rate-reduced second signal and/or the signal that characterizes the difference between the filtered and/or sampling-rate-reduced first signal and the filtered and/or sampling-rate-reduced second signal have/has a lower scanning rate than the first signal and/or the second signal.

In one further development of the method, the filtered and/or sampling-rate-reduced first signal and/or the filtered and/or sampling-rate-reduced second signal and/or the signal that characterizes the difference between the filtered and/or sampling-rate-reduced first signal and the filtered and/or sampling-rate-reduced second signal have/has a different value resolution than the first signal and/or the second signal, so that simplified processing is possible in comparison with a signal having a higher value resolution.

The present invention, for example, is advantageously usable in a control and/or regulation device, such as for a transmission control system of a motor vehicle or for the control of an internal combustion engine. In the same way, the afore-described method is at least partially able to be carried out on the control and/or regulation device. The control and/or regulation device includes appropriate circuits, e.g., ASICs (application-specific integrated circuits) and/or a computer program which may be used to process the method of the present invention.

Exemplary specific embodiments of the present invention are elucidated in greater detail below, with reference to the appended drawings. The same reference numerals are used for functionally corresponding elements and variables in all the figures, even in different specific embodiments.

DETAILED DESCRIPTION

Figure 1:
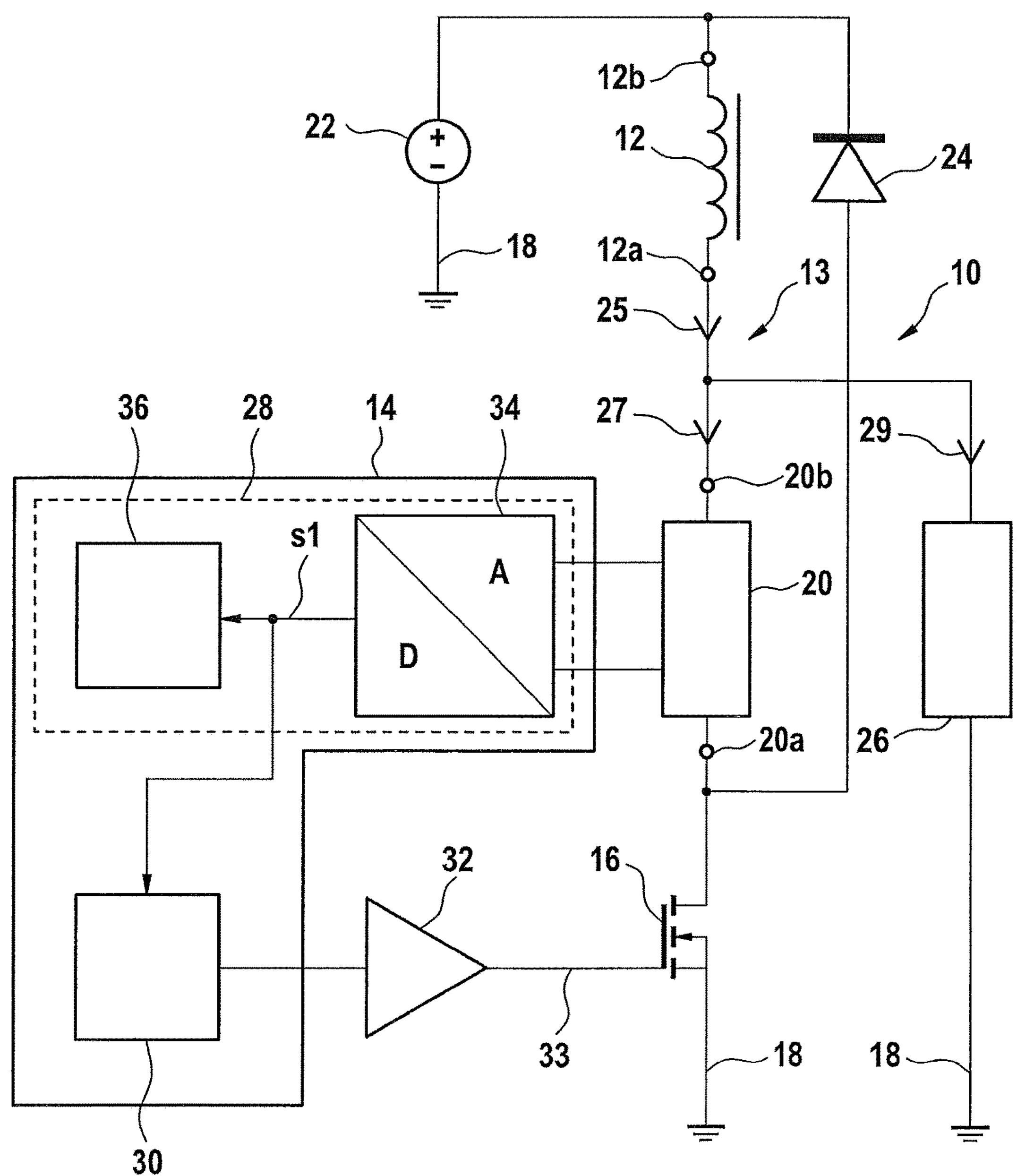
FIG. 1 shows an electronic circuit for actuating an inductive element, and a control and/or regulation device having a device for monitoring an operation of the inductive element.

FIG. 1 shows an electronic circuit 10 for actuating an inductive element 12 in a right region of the figure, and in a left region a control and/or regulation device 14 for operating electronic circuit 10 and, in particular, for monitoring the operation of inductive element 12. In this case inductive element 12 is a solenoid coil of an electromagnetic actuating device for a transmission control system for an automatic transmission of a motor vehicle.

Electronic circuit 10 includes a semiconductor switch 16, which is implemented as a MOSFET in this instance (metal oxide silicon field effect transistor) and is connected via an S-terminal (source) to a reference potential, i.e., to a zero potential 18. A D-terminal (drain) of semiconductor switch 16 is connected to a first terminal 20*a* of a current-measuring device 20, which is realized as (Ohmic) measuring resistor in this instance. A second terminal 20*b* of current-measuring device 20 is connected to a first terminal 12*a* of inductive element 12. It is obvious that current-measuring device 20 is connected in series with inductive element 12, which consequently results in a series circuit 13 of these two elements.

A second terminal 12*b* of inductive element 12 is connected to the positive pole of an operating voltage 22, while the negative pole of operating voltage 22 is connected to zero potential 18. In addition, the cathode of a diode 24 is connected at second terminal 12*b* of inductive element 12, the anode of diode 24 being connected to first terminal 20*a* of current-measuring device 20 and to the D-terminal of semiconductor switch 16. In the case in hand, a shunt 26, which is actually undesired, exists between first terminal 12*a* of inductive element 12 and zero potential 18.

In FIG. 1, shunt 26 is represented by an Ohmic resistor which, for example, has a value that is greater than the sum of a closing resistance of semiconductor switch 16 and an Ohmic resistance of current-measuring device 20, yet still has such low resistance such that shunt 26 has the ability to interfere with the operation of inductive element 12. In this case, shunt 26 is shown connected against zero potential 18. However, it is just as well possible that shunt 26 acts against the positive pole of operating voltage 22 or against some other potential, which has the same interfering effect.

FIG. 1 furthermore shows a coil current 25 through inductive element 12, and a current 27 flowing across current-measuring device 20, as well as a current 29 flowing across shunt 26.

Control and/or regulation device 14 includes a device 28 for monitoring the operation of inductive element 12, which is shown by a dashed outline in FIG. 1. In addition, control and/or regulation device 14 includes a logic circuit 30 for actuating a driver circuit 32, which is able to actuate semiconductor switch 16 at its G-terminal (gate). Driver circuit 32 generates a control voltage 33.

Device 28 encompasses a sigma-delta A/D converter 34, which is connected to two "inner" terminals (without reference numeral) of current-measuring device 20 on the input side. Such a connection type is known to one skilled in the art and will therefore not be discussed further. A voltage drop that occurs at current-measuring device 20 and characterizes current 27 flowing through current-measuring device 20 is therefore forwarded to sigma-delta A/D converter 34 as input signal. In addition, device 28 includes an evaluation device 36, which is able to analyze a time-discrete and value-discrete signal s1 generated by sigma-delta A/D converter 34, as is going to be described in greater detail below in connection with FIGS. 5 through 8.

In the case in hand, sigma-delta A/D converter 34 generates signal s1 at a value resolution (word length) of 1 bit and, for example, is a converter of the second order. However, it can just as well be realized at a higher value resolution and/or be configured as a converter of the first order or of an order higher than the second order. In specific embodiments of device 28 (not shown), the analog-digital conversion is implemented not with the aid of sigma-delta A/D converter 34 but with the aid of a conventional analog-digital converter (which operates on the basis of a known method other than the sigma-delta principle) and at a value resolution of 4 bit or 8 bit or 12 or 16 bit, for example.

In a first operating state ("energization") of electronic circuit 10, semiconductor switch 16 is switched to conductive by driver circuit 32.

Starting from a minimum value, coil current 25 flowing through inductive element 12 rises in an essentially linear fashion. At the end of the first operating state, coil current 25 has a maximum value. In the first operating state the following current flow results: From the positive pole of operating voltage 22 across inductive element 12, then across current-measuring device 20, then across semiconductor switch 16 and to zero potential 18.

Another current path results from first terminal 12*a* of inductive element 12 across shunt 26 and to zero potential

18. With that, a distribution of the current flow according to Kirchhoff's rules comes about. A potential at first terminal 12*a* of inductive element 12 is relatively low in the first operating state and the current 29 flowing across shunt 26 is therefore relatively low, as well. As a result, virtually the entire coil current 25 flows across current-measuring device 20 in the first operating state.

In a second operating state ("freewheeling"), which directly follows the first operating state, semiconductor switch 16 is blocked. Starting from the maximum value, coil current 25 flowing through inductive element 12 drops in an essentially linear fashion. At the end of the second operating state coil current 25 has the minimum value. The following current flow results in the second operating state: From first terminal 12*a* of inductive element 12 across current-measuring device 20, then across diode 24, and to second terminal 12*b* of inductive element 12.

Another current path results from first terminal 12*a* of inductive element 12 across shunt 26 and to zero potential 18. In the second operating state the potential at first terminal 12*a* of inductive element 12 is relatively high when compared with zero potential 18, and current 29 flowing across shunt 26 is therefore relatively high, as well.

Because of a physically conditioned steadiness of coil current 25 through inductive element 12, the following effect comes about in the transition from the first operating state to the second operating state: Coil current 25, which flows virtually completely across current-measuring device 20 until just prior to the end of the first operating state, also partially flows across shunt 26 to a non-negligible extent as soon as the second operating state begins. Precisely this portion of coil current 25 is missing in current-measuring device 20, so that it detects an abrupt drop in the current.

A similar effect comes about in the transition from the second operating state to the first operating state. Until just before the end of the second operating state, coil current 25 flows only partially through current-measuring device 20, because a portion of the current flowing through shunt 26 is relatively high. Starting immediately with the beginning of the first operating state, however, shunt 26 is no longer able to accept this portion because the potential at first terminal 12*a* of inductive element 12 abruptly corresponds to virtually zero potential 18. Precisely this portion of coil current 25 flows through current-measuring device 20 in addition, so that it ascertains an abrupt increase in the current. On this basis the existence of shunt 26 may be inferred.

Comparable effects come about in cases in which, as previously described, shunt 26 occurs with respect to the positive pole of operating voltage 22, for example. Here, too, a usually abrupt change in the current flowing across current-measuring device 20 arises in the transition between the particular operating states, which therefore also makes it possible to infer the existence of shunt 26.

Figure 2:
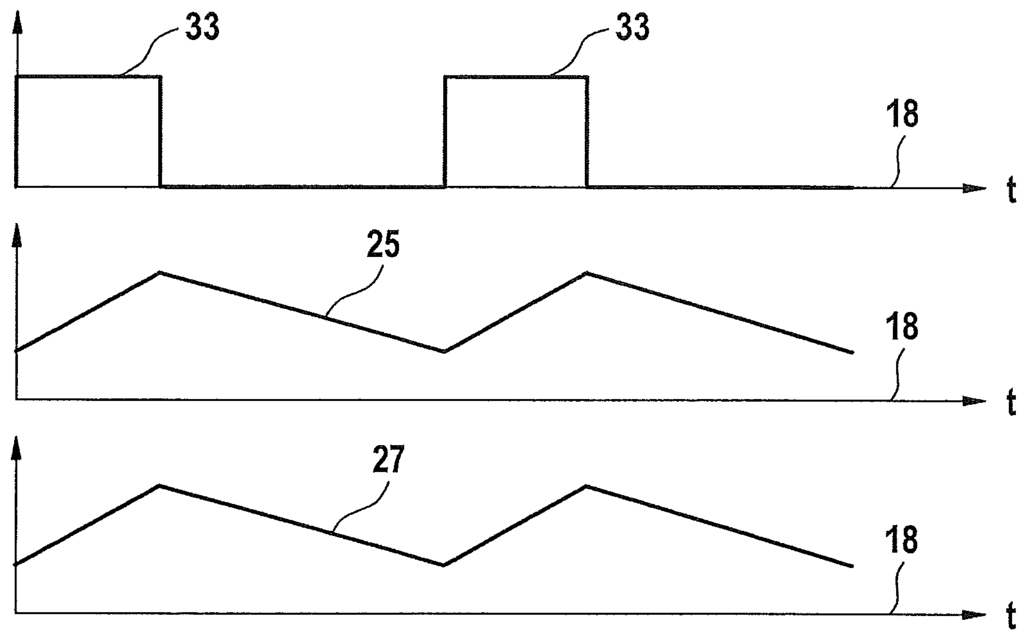
FIG. 2 shows three first time diagrams with signals that characterize the electronic circuit of FIG. 1.

FIG. 2 shows three time diagrams with signals of electronic circuit 10 from FIG. 1, in which no shunt 26 is present, however. The diagrams share an identical time scale. Control voltage 22 is illustrated in an upper diagram in FIG. 2. A value of control voltage 33 that differs from zero potential 18 controls semiconductor switch 16 into the conductive state and brings about the afore-described first operating state. A value of control voltage 33 that is similar to zero potential 18 controls semiconductor switch 16 into the blocking state, so that the afore-described second operating state results.

The center time diagram in FIG. 2 illustrates a time characteristic of coil current 25, and the lower time diagram illustrates a time characteristic of current 27 flowing across current-measuring device 20. It is obvious that both currents are steady and essentially alike.

Figure 3:
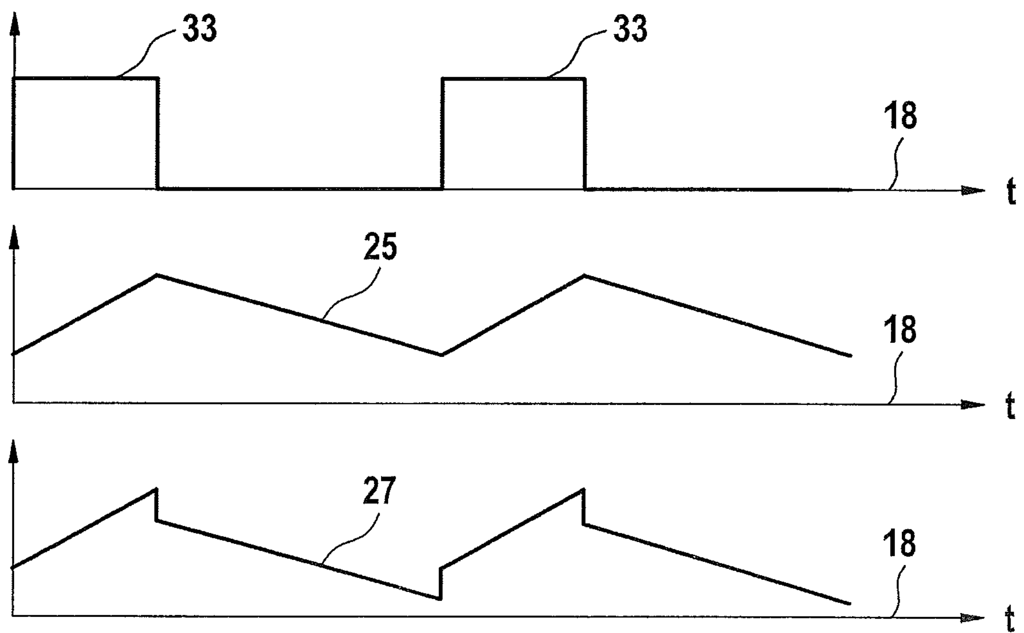
FIG. 3 shows three second time diagrams with signals that characterize the electronic circuit of FIG. 1.

Similar to FIG. 2, FIG. 3 also shows three time diagrams with signals of electronic circuit 10 from FIG. 1, but in this case a shunt 26 is present as illustrated in FIG. 1. It can be seen that current 27 flowing across current-measuring device 20 exhibits abrupt changes, as described earlier in connection with FIG. 1, which make it possible to infer the existence of shunt 26.

Figure 4:
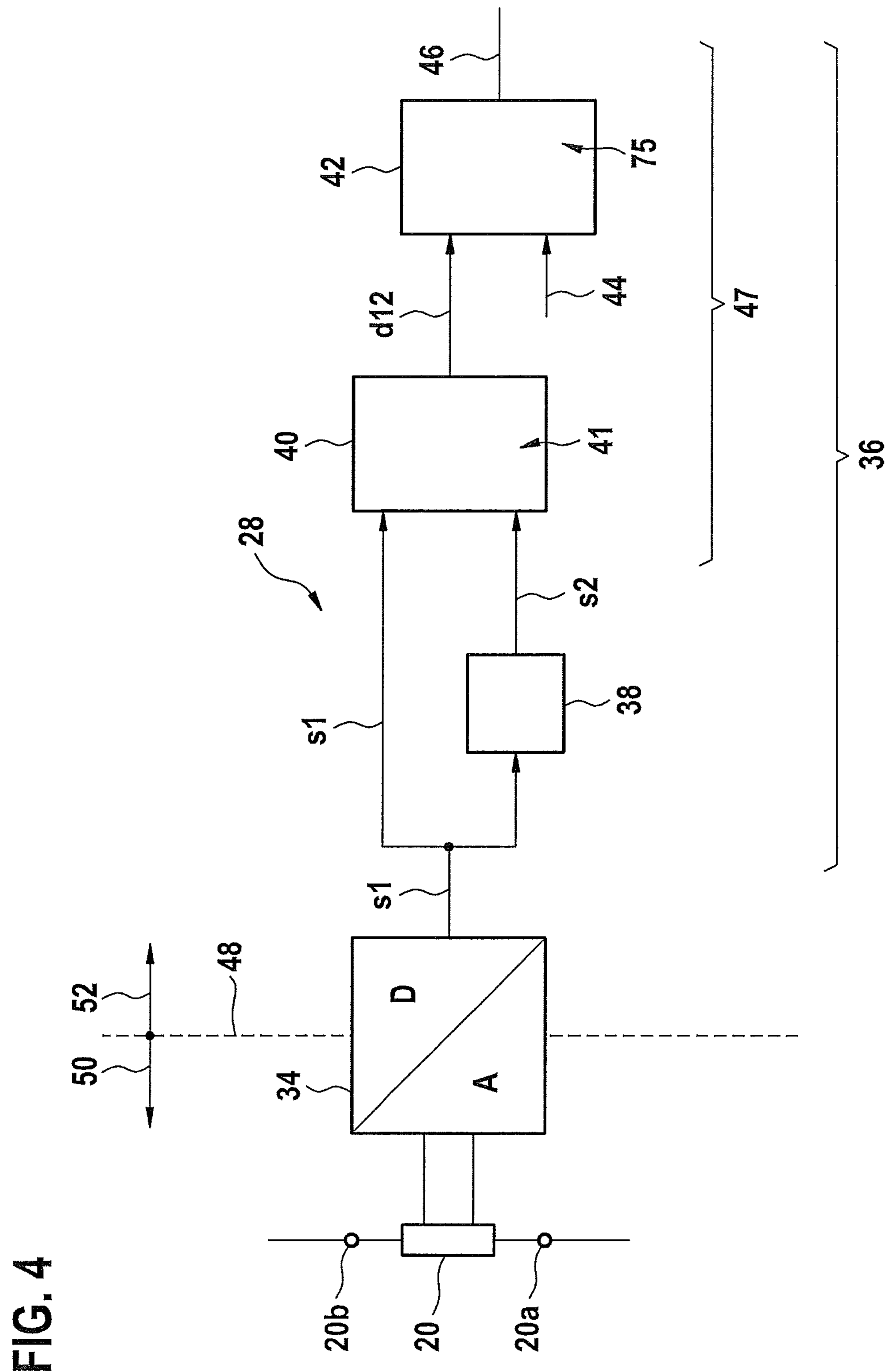
FIG. 4 shows a first block diagram for the device from FIG. 1.

FIG. 4 shows a simplified first block diagram for device 28 for monitoring the operation of inductive element 12 according to one specific embodiment. A signal direction is essentially from left to right in FIG. 4. Similar to FIG. 1, sigma-delta A/D converter 34 is used for ascertaining the time-discrete and value-discrete first signal s1, which characterizes current 27 flowing through current-measuring device 20. Also ascertained is a time-discrete and value-discrete second signal s2, which characterizes current 27 flowing through current-measuring device 20. Second signal s2 has a predefinable time shift in relation to first signal s1. Second signal s2 is obtained from first signal s1 through a delay operation 38. In one specific embodiment of device 28, delay operation 38 is configurable.

In a following block 40, first signal s1 is compared with second signal s2. A difference between first signal s1 and second signal s2 is calculated, which may be done by subtraction 41. An output signal of block 40 corresponds to a signal d12 that characterizes the difference between first signal s1 and second signal s2.

In a following block 42, signal d12 which characterizes the difference between first signal s1 and second signal s2 is compared with a predefinable threshold value 44 (comparison 75, see FIGS. 5 through 9). In one specific embodiment of device 28, which is not illustrated, said comparison takes place using a signal d12' or d12" derived from signal d12. For example, signal d12' is derived from signal d12 by filtering and/or decimation and/or a sampling-rate reduction or the like. See also FIGS. 5 through 8 further below in this context.

In the least complicated case, output signal 46 of block 42 is a binary signal, which enables a "Yes-No decision" with regard to the possible existence of shunt 26. It is possible to use threshold value 44 to predefine how "powerful" a shunt 26 has to be in order to be considered interfering. Jointly, blocks 40 and 42 allow a comparison 47 of first signal s1 with second signal s2 so as to infer the existence of shunt 26.

In considerably simplified and generalized terms, it can be said that a transmission function between an output of sigma-delta A/D converter 34 and block 42 is similar to a bandpass. For one, this is due to low-pass filtering which may be performed (see FIGS. 5 through 8) and for another, to a high-pass characteristic that exists when calculating the difference of identical but time-shifted signals s1 and s2. In this way relatively rapid changes in signal s1 are able to be recognized and utilized for detecting shunt 26.

A dashed perpendicular line 48 differentiates the particular type of signal processing. To the left of line 48, in the direction of an arrow 50, the signals are analog. To the right of line 48, in the direction of an arrow 52, the signals are digital.

Figure 5:
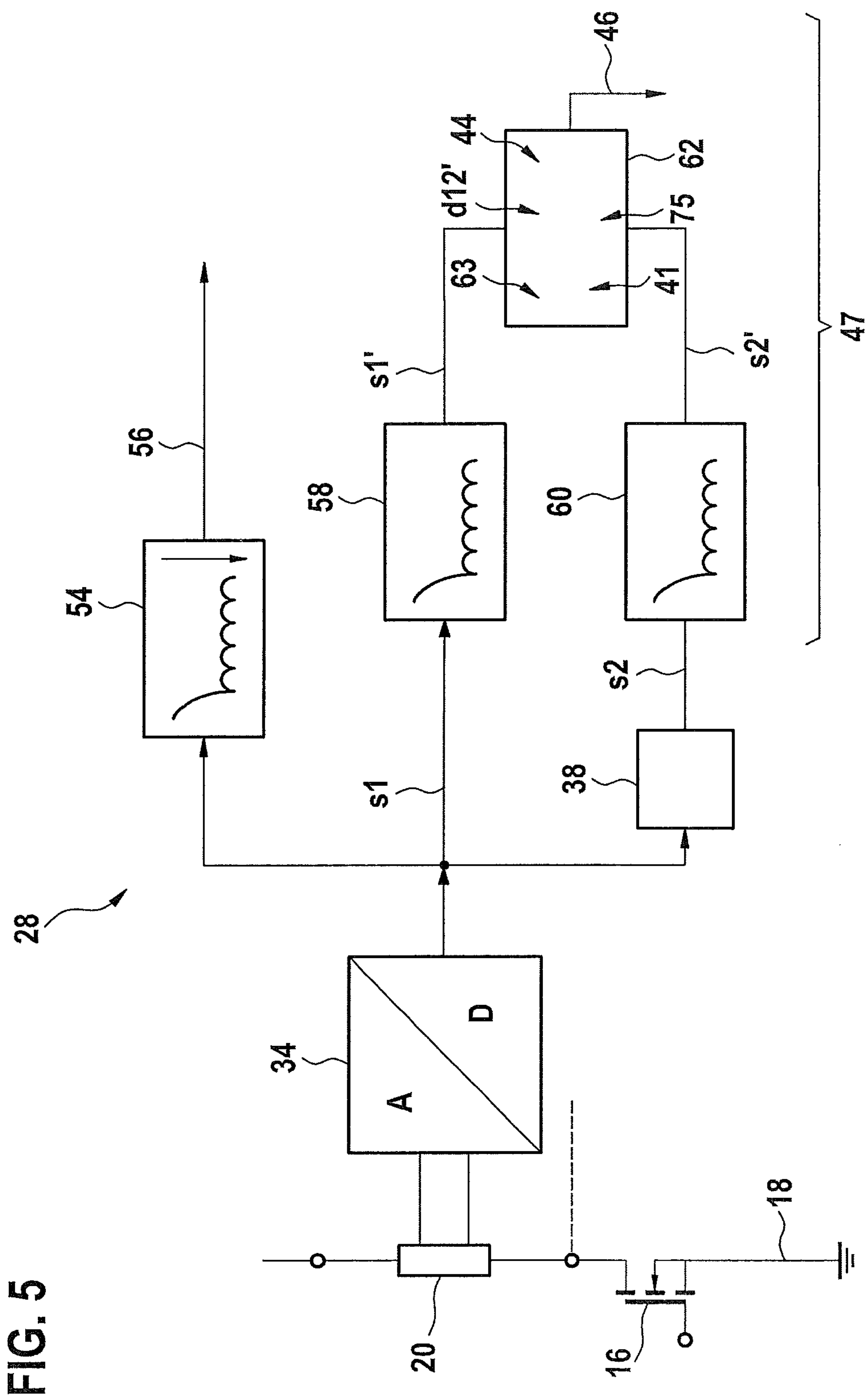
FIG. 5 shows a second block diagram for the device from FIG. 1.

FIG. 5 shows a further block diagram for device 28 for monitoring the operation of inductive element 12 according to one specific embodiment. A left region in FIG. 5 includes semiconductor switch 16, current-measuring device 20 as well as sigma-delta A/D converter 34 and corresponds to the afore-described FIGS. 1 and 4. Signal processing in FIGS. 5 through 8 is essentially performed from left to right. As described in FIG. 4 by line 48, a separation between analog and digital signals upstream or downstream from sigma-delta A/D converter 34 applies in FIGS. 5 through 8, as well.

An upper signal path in FIG. 5 is used for controlling semiconductor switch 16, among other things, and represented by logic circuit 30 in FIG. 1. In this case a first low-pass filter 54 is situated in said signal path, and a decimation and/or sampling-rate reduction of the signal takes place in addition. An output signal 56 of low-pass filter 54 has a data rate ("sampling rate") of 5 kS/s (kilo samples per second) and a value resolution (word length) of 16 bit. Incidentally, the upper signal path does not affect the present invention directly and for this reason will not be discussed further.

A center signal path in FIG. 5 characterizes signal s1, which is routed through a second low-pass filter 58. In this instance, however, no decimation or sampling-rate reduction takes place. A filtered signal s1' results at the output of second low-pass filter 58. A lower signal path in FIG. 5 characterizes signal s2, which is generated with a delay from first signal s1 by delay operation 38, and is then is routed across a third low-pass filter 60. In this case, as well, no decimation or sampling-rate reduction takes place. A filtered signal s2' results at the output of third low-pass filter 60.

However, in one specific embodiment of device 28, signals s1' and/or s2' and/or d12' are/is subjected to a decimation and/or sampling-rate reduction. This may be done by "subsampling" or "down-clocking", for instance, especially by periodically omitting scanning values (or also by underscanning in combination with interpolation). Signals s1' and/or s2' and/or d12' have a lower sampling rate than first signal s1 and/or second signal s2. In addition or as an alternative, signals s1' and/or s2' and/or d12' have a different value resolution than first signal s1 and/or second signal s2 in one further specific embodiment of device 28.

Low-pass filters 54, 58 and 60 may be implemented in many variants, e.g., using comb filters, recursive filters (IIR=infinite impulse response") or non-recursive filters (FIR ("finite pulse response") and the like. Low-pass filters 58 and 60 may have the same filter parameters with respect to each other. In one specific embodiment of device 28, low-pass filters 58 and 60 have an order that is at least one order higher than that of sigma-delta A/D converter 34. If sigma-delta A/D converter 34 is of the second order, for instance, low-pass filters 58 and 60 are of the third order, for instance.

In one specific embodiment of device 28, which is not shown, low-pass filters 58 and 60 have different filter parameters, so that different propagation times result in relation to each other, which makes delay operation 38 unnecessary in this special case. In one further specific embodiment (not shown further) of device 28, band-pass filters instead of low-pass filters 58 and 60 are provided.

Filtered signals s1' and s2' are forwarded to a block 62, in which subtraction 41 according to block 40 from FIG. 4 takes place, among other things. That is to say, the following steps are performed in block 62 within the scope of comparison 47: Calculating a difference between filtered and/or sampling-rate-reduced first signal s1' and filtered and/or sampling-rate-reduced second signal s2', especially by subtraction 41, in order to obtain a signal d12' which characterizes the difference between filtered and/or sampling-rate-reduced first signal s1' and filtered and/or sampling-rate-reduced second signal s2'; and comparing 75 signal d12' that characterizes the difference between filtered and/or sampling-rate-reduced first signal s1' and filtered and/or sampling-rate-reduced second signal s2' and/or a signal d12" derived therefrom (see FIG. 8), with predefinable threshold value 44.

Alternative specific embodiments of device 28 are possible in the present invention. For example, only a single low-pass filter 58 can be used, in which case signal s2' is generated in that signal s1' is buffer-stored at the output of low-pass filter 58 and delayed and then compared with non-delayed signal s1'.

Signal s1 at the output of sigma-delta A/D converter 34, for example, has a value resolution of one bit and a data rate (sampling rate) of 2.5 MS/s (mega samples per second). Here, filtered signals s1' and s2' have a value resolution of ten bit and a data rate of 2.5 MS/s. It is understood that device 28 of the present invention may also be configured for virtually any other type of value resolutions and/or data rates or sampling rates. This also applies to the following FIGS. 6 through 9.

In one specific embodiment of device 28, the precision or the value resolution in the signal paths used for signals s1 and s2 is markedly lower than in the upper signal path in FIG. 5. This can be the case if the demands on the accuracy of the shunt detection are lower than those required for the current control of the inductive element.

Low-pass filters 58 and 60 may be configured in such a way that possibly existing interference frequencies in the system are filtered out, while the characteristics of sigma-delta A/D converter 34 are taken into account in so doing. This applies in particular to the "order" of sigma-delta A/D converter 34 and a quantization noise generated by sigma-delta A/D converter 34.

Figure 6:
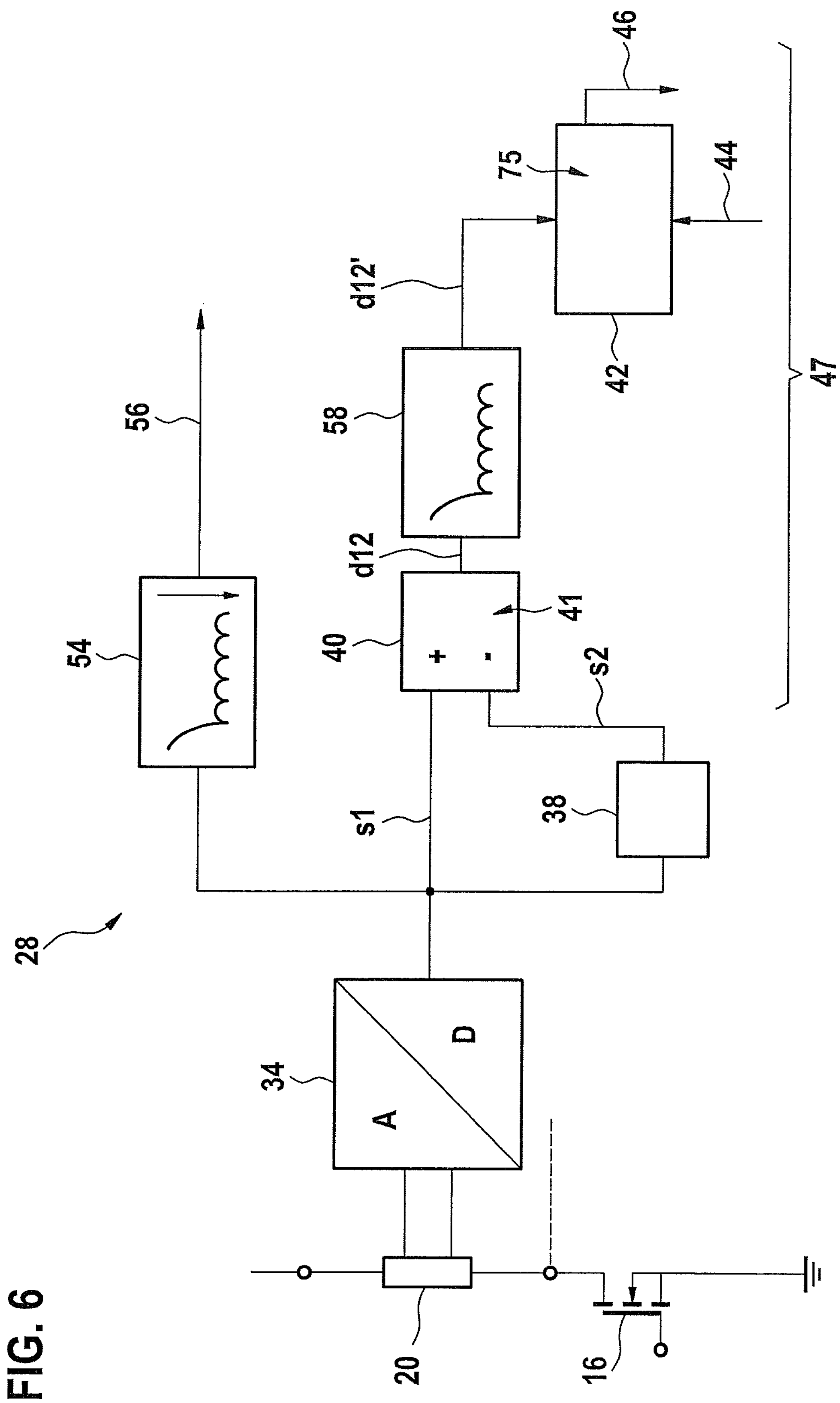
FIG. 6 shows a third block diagram for the device from FIG. 1.

FIG. 6 shows a another specific development of device 28 for monitoring the operation of inductive element 12. In contrast to FIG. 5, in FIG. 6 difference calculation 41 of first signal s1 with second signal s2 in the signal path takes place before the filtering by low-pass filter 58. This makes it possible to dispense with second low-pass filter 60, which saves costs without adversely affecting the function of device 28. Signal d12' at the output of low-pass filter 58 is forwarded to block 42 (see FIG. 4), where comparison 75 of signal d12' with threshold value 44 takes place.

Figure 7:
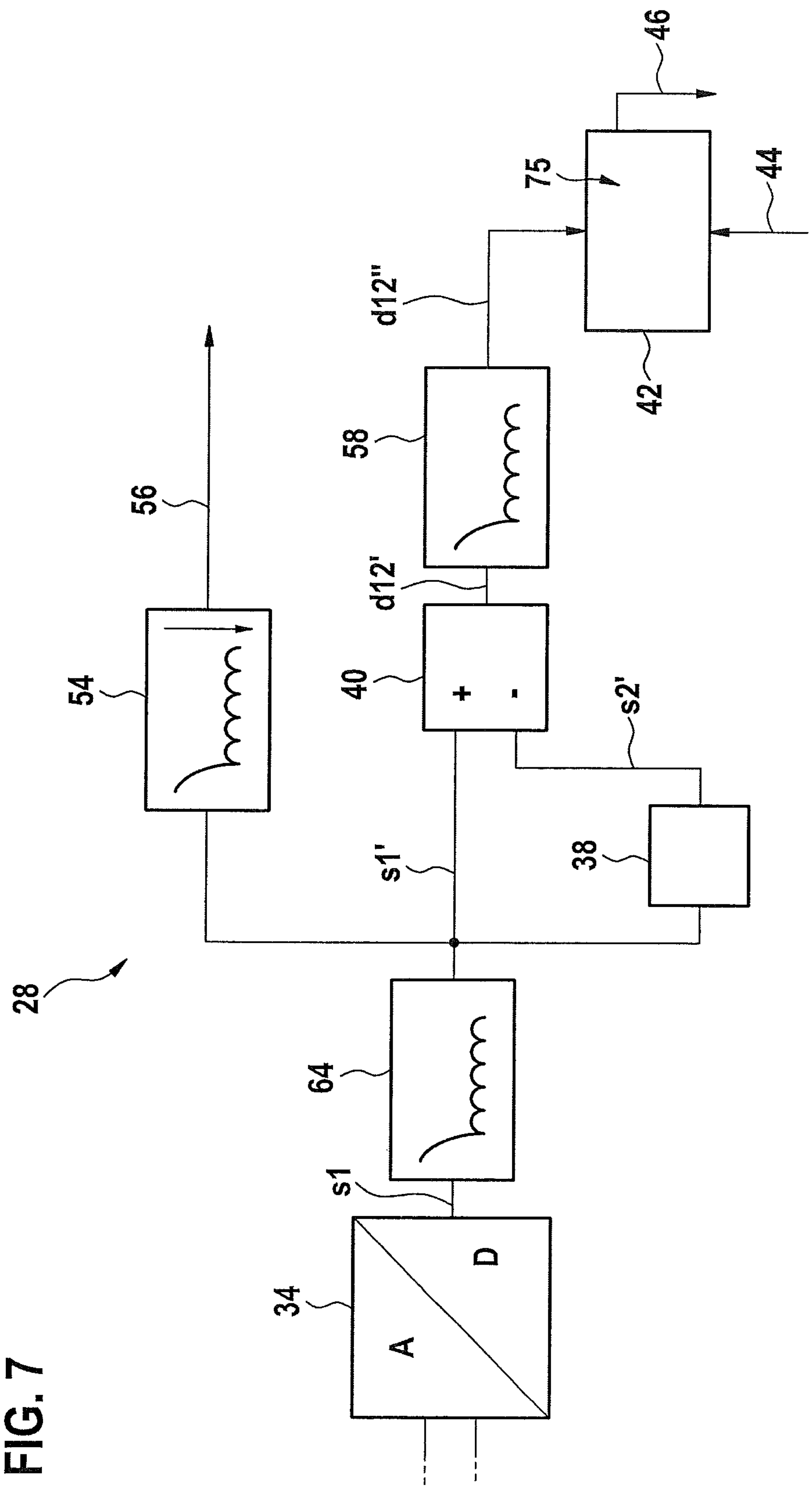
FIG. 7 shows a fourth block diagram for the device from FIG. 1.

FIG. 7 shows a still further specific embodiment of device 28. In contrast to FIG. 6, signal s1 is first filtered by a fourth low-pass filter 64 and then processed further, as already described in connection with FIG. 6. Low-pass filter 64 enables additional filtering of interference signal components or of quantization noise and the like. As shown, first low-pass filter 54 is advantageously also supplied with signal s1 which has been prefiltered by low-pass filter 64. Signal d12" is then applied at the output of low-pass filter 58, which thus has been low-pass-filtered twice, starting from sigma-delta A/D converter 34.

Figure 8:
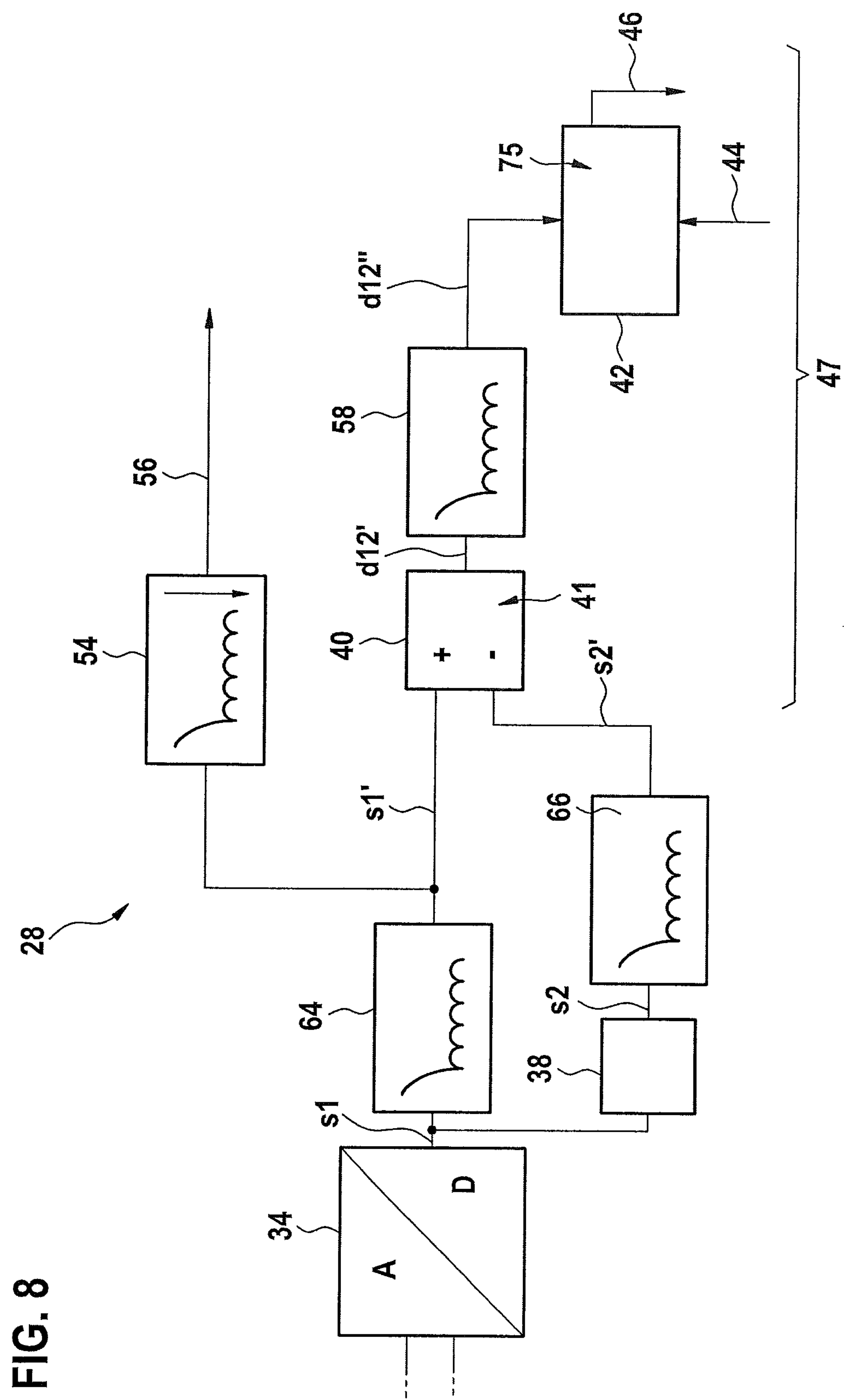
FIG. 8 shows a fifth block diagram for the device from FIG. 1.

FIG. 8 shows yet another specific embodiment of device 28. In contrast to FIG. 7, a fifth low-pass filter 66, which is functionally identical to low-pass filter 64, is used for ascertaining second signal s2'. Device 28 of FIG. 8 thus includes a total of four low-pass filters 54, 58, 64 and 66. The specifications described earlier in connection with FIG. 5 accordingly apply to the particular value resolutions, data rates or sampling rates as well as to the possible specific embodiments of low-pass filters 54, 58, 64 and 66.

Figure 9:
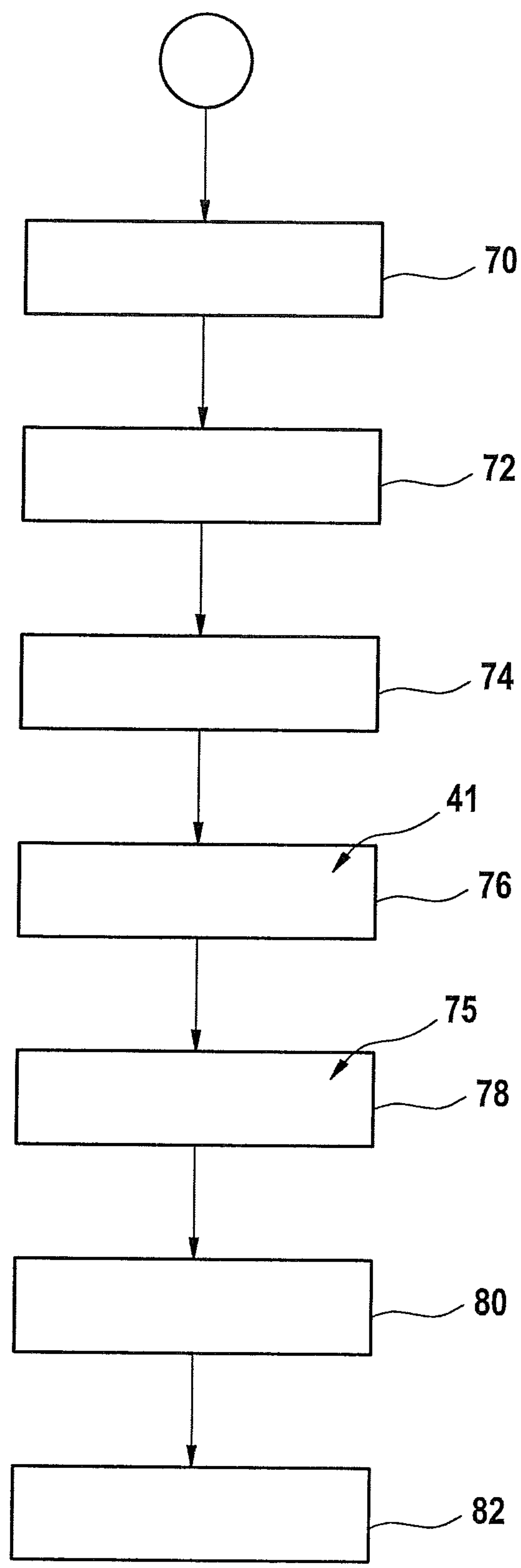
FIG. 9 shows a flow chart for a method for monitoring the operation of the inductive element.

FIG. 9 shows a flow chart for a method for monitoring the operation of inductive element 12, which is actuated by control and/or regulation device 14 by electronic circuit 10. The procedure shown in FIG. 9 begins in a start block 70. A first time-discrete and value-discrete signal s1, which characterizes current 27 flowing through current-measuring device 20, is ascertained in a block 72.

In a block 74, a second time-discrete and value-discrete second signal s2, which characterizes current 27 flowing through current-measuring device 20, is ascertained. This is done in such a way that signal s2 has a predefinable time shift in relation to first signal s1.

In a following block 76, difference calculation 41 of first signal s1 and second signal s2 is performed. In a following block 78, signal d12 or d12' or d12" generated by difference calculation 41 is analyzed in that it is compared to predefinable threshold value 44 (comparison 75) in order to infer the existence of shunt 26. In one specific embodiment of the method, threshold value 44 may specify a measure starting from which shunt 26 is evaluated as "serious".

In a subsequent block 80, a response as a function of the analysis performed in block 78 takes place in control and/or regulation device 14. For example, a bit may be set in a fault memory and/or a warning may be output to the driver of a motor vehicle, or the like. The procedure shown in FIG. 9, which may be repeated from time to time, ends in an end block 82. In one specific embodiment of the method, the procedure is repeated periodically.

What is claimed is:

1. A device for monitoring an operation of an inductive element, comprising:

a current-measuring device connected in series with the inductive element;

a determining arrangement to ascertain a first time-discrete and value-discrete signal, which characterizes a current flowing through the current-measuring device, to ascertain a second time-discrete and value-discrete signal, which characterizes a current flowing through the current-measuring device and has a predefinable time shift in relation to the first signal, and to infer the presence of an undesired shunt from a comparison of the first signal with the second signal, wherein the determining arrangement is configured to obtain the second signal from the first signal through a delay operation;

a switch arrangement coupled to a first terminal of the current-measuring device, wherein a second terminal of the current-measuring device is coupled to a terminal of the inductive element; and a control and driving arrangement coupled to the determining arrangement and coupled to the switch arrangement to control and drive the switch arrangement;

wherein the determining arrangement is configured to ascertain the first signal in that a voltage drop that arises in the current-measuring device and characterizes the current flowing through the current-measuring device, is ascertained and converted into the first signal by an A/D converter, wherein one of (i) and (ii) is satisfied:

(i) the determining arrangement is configured to perform the following within the framework of the comparison:

forming a signal that characterizes a difference between the first signal and the second signal; and comparing the signal that characterizes the difference between the at least one of the first signal and the second signal or a signal derived therefrom, with a corresponding predefinable threshold value, and wherein the determining arrangement is configured to subject the signal that characterizes the difference between the at least one of the first signal and the second signal or a signal derived therefrom to at least one of filtering, decimation, and a sampling-rate reduction, and (ii) the determining arrangement is configured to perform the following within the framework of the comparison:

subjecting the at least one of the first signal and the second signal to an adaptive process to obtain an adapted first signal and an adapted second signal;

determining a difference between the adapted first signal and the adapted second signal to obtain a signal that characterizes the difference between the adapted first signal and the adapted second signal; and comparing the signal that characterizes the difference between the adapted first signal and the adapted second signal with a corresponding predefinable threshold value;

wherein at least one of (i) the adapted first signal, (ii) the adapted second signal, and (iii) the signal that characterizes the difference between the adapted first signal and the adapted second signal, has a different sampling rate than the at least one of the first signal and the second signal.

2. The device of claim 1, wherein the determining arrangement is configured to perform the following within the framework of the comparison:

subjecting the at least one of the first signal and the second signal to at least one of filtering, decimation, and a sampling-rate reduction to obtain at least one of a filtered first signal and a sampling-rate-reduced first signal and at least one of a filtered second signal and a sampling-rate-reduced second signal;

determining a difference between the at least one of the filtered first signal and a sampling-rate-reduced first signal and the at least one of the filtered second signal and the sampling-rate-reduced second signal, through a difference calculation, to obtain a signal that characterizes the difference between the at least one of the filtered first signal, the sampling-rate-reduced first signal and the at least one of the filtered second signal and the scanning-rate reduced second signal; and comparing the signal that characterizes the difference between the at least one of the filtered first signal and the sampling-rate-reduced first signal and the at least one of the filtered second signal and the sampling-rate-reduced second signal or a signal derived therefrom, with a corresponding predefinable threshold value.

3. A device for monitoring an operation of an inductive element, a current-measuring device being connected in series with the inductive element, comprising:

a determining arrangement to ascertain a first time-discrete and value-discrete signal, which characterizes a current flowing through the current-measuring device, to ascertain a second time-discrete and value-discrete signal, which characterizes a current flowing through the current-measuring device and has a predefinable time shift in relation to the first signal, and to infer the presence of an undesired shunt from a comparison of the first signal with the second signal;

wherein the determining arrangement is configured to obtain the second signal from the first signal through a delay operation, wherein the determining arrangement is configured to perform the following within the framework of the comparison:

subjecting the at least one of the first signal and the second signal to at least one of filtering, decimation, and a sampling-rate reduction to obtain at least one of a filtered first signal and a sampling-rate-reduced first signal and at least one of a filtered second signal and a sampling-rate-reduced second signal;

determining a difference between the at least one of the filtered first signal and a sampling-rate-reduced first signal and the at least one of the filtered second signal and the sampling-rate-reduced second signal, through a difference calculation, to obtain a signal that characterizes the difference between the at least one of the filtered first signal, the sampling-rate-reduced first signal and the at least one of the filtered second signal and the scanning-rate reduced second signal; and comparing the signal that characterizes the difference between the at least one of the filtered first signal and the sampling-rate-reduced first signal and the at least one of the filtered second signal and the sampling-rate-reduced second signal or a signal derived therefrom, with a corresponding predefinable threshold value, and wherein at least one of (i) the at least one of the filtered first signal and the sampling-rate-reduced first signal, (ii) the at least one of the filtered second signal and the sampling-rate-reduced second signal, and (iii) the signal that characterizes the difference between the at least one of the filtered first signal and the sampling-rate-reduced first signal and the at least one of the filtered second signal and the sampling-rate-reduced second signal, has a lower sampling rate than the at least one of the first signal and the second signal.

4. A method for monitoring an operation of an inductive element, a current-measuring device being connected in series with the inductive element, the method comprising:

ascertaining, via a determining arrangement, a first time-discrete and value-discrete signal, which characterizes a current flowing through the current measuring device;

ascertaining, via the determining arrangement, a second time-discrete and value-discrete signal, which characterizes a current flowing through the current-measuring device and which has a predefinable time shift in relation to the first signal; and comparing the first signal with the second signal to infer the presence of an undesired shunt;

wherein the second signal is formed from the first signal through a delay operation wherein a switch arrangement is coupled to a first terminal of the current-measuring device, and wherein a second terminal of the current-measuring device is coupled to a terminal of the inductive element, wherein a control and driving arrangement is coupled to the determining arrangement and coupled to the switch arrangement to control and drive the switch arrangement, wherein the determining arrangement is configured to ascertain the first signal in that a voltage drop that arises in the current-measuring device and characterizes the current flowing through the current-measuring device, is ascertained and converted into the first signal by an A/D converter, wherein one of (i) and (ii) is satisfied:

(i) the determining arrangement is configured to perform the following within the framework of the comparison:

forming a signal that characterizes a difference between the first signal and the second signal; and comparing the signal that characterizes the difference between the at least one of the first signal and the second signal or a signal derived therefrom, with a corresponding predefinable threshold value, and wherein the determining arrangement is configured to subject the signal that characterizes the difference between the at least one of the first signal and the second signal or a signal derived therefrom to at least one of filtering, decimation, and a sampling-rate reduction, and (ii) the determining arrangement is configured to perform the following within the framework of the comparison:

subjecting the at least one of the first signal and the second signal to an adaptive process to obtain an adapted first signal and an adapted second signal;

determining a difference between the adapted first signal and the adapted second signal to obtain a signal that characterizes the difference between the adapted first signal and the adapted second signal; and comparing the signal that characterizes the difference between the adapted first signal and the adapted second signal with a corresponding predefinable threshold value;

wherein at least one of (i) the adapted first signal, (ii) the adapted second signal, and (iii) the signal that characterizes the difference between the adapted first signal and the adapted second signal, has a different sampling rate than the at least one of the first signal and the second signal.

5. The method of claim 4, wherein the following are performed within the framework of the comparison:

subjecting at least one of the first signal and the second signal to at least one of filtering, decimation and a sampling-rate reduction to obtain at least one of a filtered first signal and the sampling-rate-reduced first signal and at least one of a filtered second signal and the sampling-rate-reduced second signal;

calculating a difference between the at least one of the filtered first signal and the sampling-rate-reduced first signal and the at least one of the filtered second signal and the sampling-rate-reduced second signal, by subtraction, to obtain a signal that characterizes the difference between the at least one of the filtered first signal and sampling-rate-reduced first signal and the filtered or sampling-rate-reduced second signal; and comparing the signal that characterizes the difference between the filtered or sampling-rate-reduced first signal and the at least one of the filtered second signal and the sampling-rate-reduced second signal or a signal derived therefrom, with a corresponding predefinable threshold value.

6. A method for monitoring an operation of an inductive element, a current-measuring device being connected in series with the inductive element, the method comprising:

ascertaining a first time-discrete and value-discrete signal, which characterizes a current flowing through the current measuring device;

ascertaining a second time-discrete and value-discrete signal, which characterizes a current flowing through the current-measuring device and which has a predefinable time shift in relation to the first signal; and comparing the first signal with the second signal to infer the presence of an undesired shunt;

wherein the second signal is formed from the first signal through a delay operation, wherein the following are performed within the framework of the comparison:

subjecting at least one of the first signal and the second signal to at least one of filtering, decimation and a sampling-rate reduction to obtain at least one of a filtered first signal and the sampling-rate-reduced first signal and at least one of a filtered second signal and the sampling-rate-reduced second signal;

calculating a difference between the at least one of the filtered first signal and the sampling-rate-reduced first signal and the at least one of the filtered second signal and the sampling-rate-reduced second signal, by subtraction, to obtain a signal that characterizes the difference between the at least one of the filtered first signal and sampling-rate-reduced first signal and the filtered or sampling-rate-reduced second signal; and comparing the signal that characterizes the difference between the filtered or sampling-rate-reduced first signal and the at least one of the filtered second signal and the sampling-rate-reduced second signal or a signal derived therefrom, with a corresponding predefinable threshold value, and wherein at least one of: (i) the at least one of the filtered first signal and the sampling-rate-reduced first signal, (ii) the at least one of the filtered second signal and the sampling-rate-reduced second signal, and (iii) the signal that characterizes the difference between the at least one of the filtered first signal and the sampling-rate-reduced first signal and the at least one of the filtered second signal and the sampling-rate-reduced second signal, has a lower sampling rate than the first signal or the second signal.

7. The method of claim 4, wherein the first signal is ascertained in that a voltage drop that arises in the current-measuring device and characterizes the current flowing through the current-measuring device is ascertained and converted into the first signal by a sigma-delta A/D converter.

8. The method of claim 4, wherein the following are performed within the framework of the comparison:

forming a signal that characterizes a difference between the first signal and the second signal, by a difference calculation of the signals; and comparing the signal that characterizes the difference between the first signal and the second signal or a signal derived therefrom, with a corresponding predefinable threshold value.

9. The device of claim 1, wherein the determining arrangement is configured to ascertain the first signal in that a voltage drop that arises in the current-measuring device and characterizes the current flowing through the current-measuring device, is ascertained and converted into the first signal by a sigma-delta A/D converter.

10. The device of claim 1, wherein the determining arrangement is configured to perform the following within the framework of the comparison:

determining a signal that characterizes a difference between the first signal and the second signal, by a difference calculation of the signals; and comparing the signal that characterizes the difference between the first signal and the second signal or a signal derived therefrom, with a corresponding predefinable threshold value.

11. The device of claim 1, wherein the determining arrangement is configured to perform the following within the framework of the comparison:

subjecting the at least one of the first signal and the second signal to an adaptive process to obtain an adapted first signal and an adapted second signal;

determining a difference between the adapted first signal and the adapted second signal to obtain a signal that characterizes the difference between the adapted first signal and the adapted second signal; and comparing the signal that characterizes the difference between the adapted first signal and the adapted second signal with a corresponding predefinable threshold value;

wherein at least one of (i) the adapted first signal, (ii) the adapted second signal, and (iii) the signal that characterizes the difference between the adapted first signal and the adapted second signal, has a different sampling rate than the at least one of the first signal and the second signal.

12. The device of claim 1, wherein the different sampling rate is lower than the at least one of the first signal and the second signal.

13. The method of claim 4, wherein the following are performed within the framework of the comparison:

subjecting the at least one of the first signal and the second signal to an adaptive process to obtain an adapted first signal and an adapted second signal;

determining a difference between the adapted first signal and the adapted second signal to obtain a signal that characterizes the difference between the adapted first signal and the adapted second signal; and comparing the signal that characterizes the difference between the adapted first signal and the adapted second signal with a corresponding predefinable threshold value;

wherein at least one of (i) the adapted first signal, (ii) the adapted second signal, and (iii) the signal that characterizes the difference between the adapted first signal and the adapted second signal, has a different sampling rate than the at least one of the first signal and the second signal.

14. The method of claim 13, wherein the different sampling rate is lower than the at least one of the first signal and the second signal.

* * * * *